United States Patent [19]
Nguyen et al.

[11] Patent Number: 5,126,592
[45] Date of Patent: Jun. 30, 1992

[54] CIRCUIT HAVING A DELAY LINE FOR USE IN A DATA PROCESSING SYSTEM OR LOGIC SYSTEM

[76] Inventors: Nam K. Nguyen, 4110 Seri St., San Diego, Calif. 92117; Stuart C. Rowson, 2122 Yankee Ct., Escondido, Calif. 92025; Richard A. Daniel, 749 Harding, Escondido, Calif. 92027

[21] Appl. No.: 417,960

[22] Filed: Oct. 5, 1989

[51] Int. Cl.⁵ .................. H03K 17/16; H03K 19/003
[52] U.S. Cl. ............................. 307/443; 307/606; 307/542
[58] Field of Search .............. 328/56, 55; 307/606, 307/443, 542, 555, 558; 333/124, 17.3, 32, 130, 138, 156

[56] References Cited

U.S. PATENT DOCUMENTS

| | | | |
|---|---|---|---|
| 2,217,957 | 10/1940 | Lewis | 178/44 |
| 3,001,137 | 9/1961 | Kassel et al. | 328/38 |
| 3,068,405 | 12/1962 | Glazer et al. | 324/68 |
| 3,364,479 | 1/1968 | Henderson et al. | 340/324 |
| 3,428,905 | 2/1969 | Fierston et al. | 328/127 |
| 3,508,082 | 4/1970 | Breimer | 307/268 |
| 3,624,519 | 11/1971 | Beydler | 328/66 |
| 3,725,790 | 4/1973 | Ault et al. | 328/37 |
| 3,817,582 | 6/1974 | Green et al. | 307/262 |
| 4,105,980 | 8/1978 | Cowardin et al. | 328/165 |
| 4,316,148 | 2/1982 | Kaminski | 328/55 |
| 4,316,148 | 2/1982 | Kaminski | 328/55 |
| 4,701,714 | 10/1987 | Agoston | 328/56 |

*Primary Examiner*—Edward P. Westin
*Assistant Examiner*—Richard Roseen

[57] ABSTRACT

A circuit for generating signals in a data processing system has a passive delay line and logic gates connected to the output taps of the delay line. Isolation resistors are connected between the output taps and the logic gates in order to substantially reduce signal reflections in the signal path within the delay line that are caused by the input capacitance of the logic gates.

4 Claims, 3 Drawing Sheets

FIG. 1   PRIOR ART
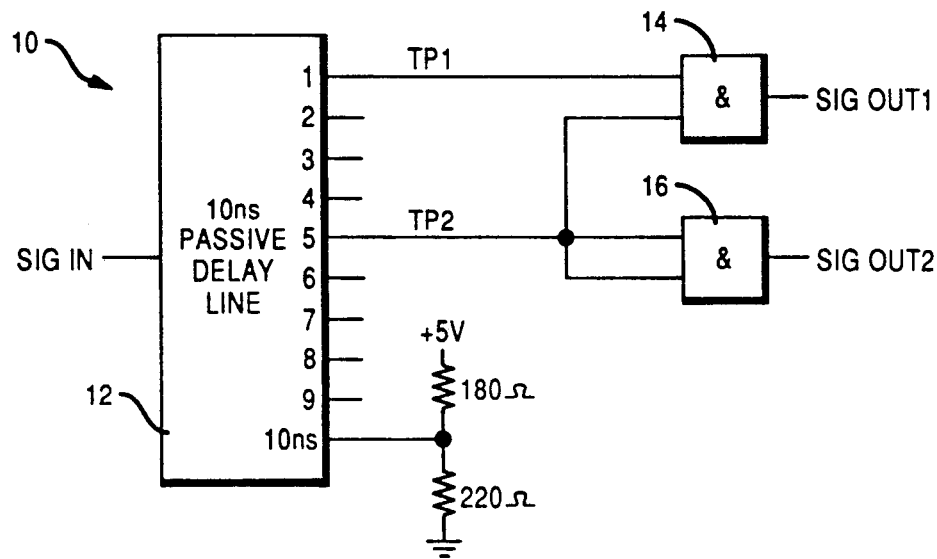
PRIOR ART   FIG. 3
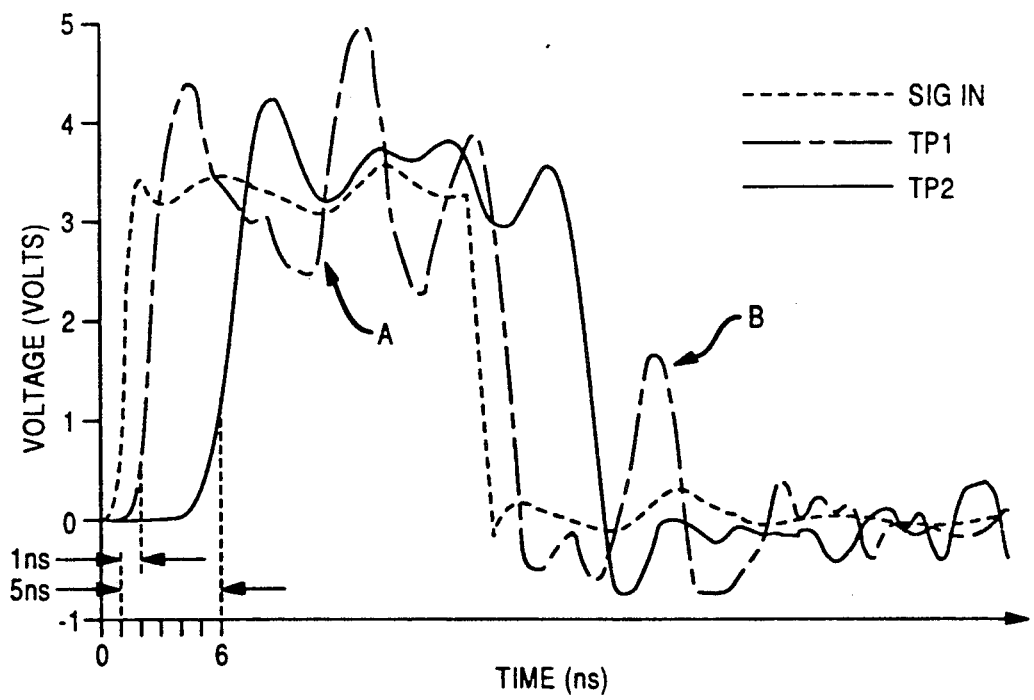

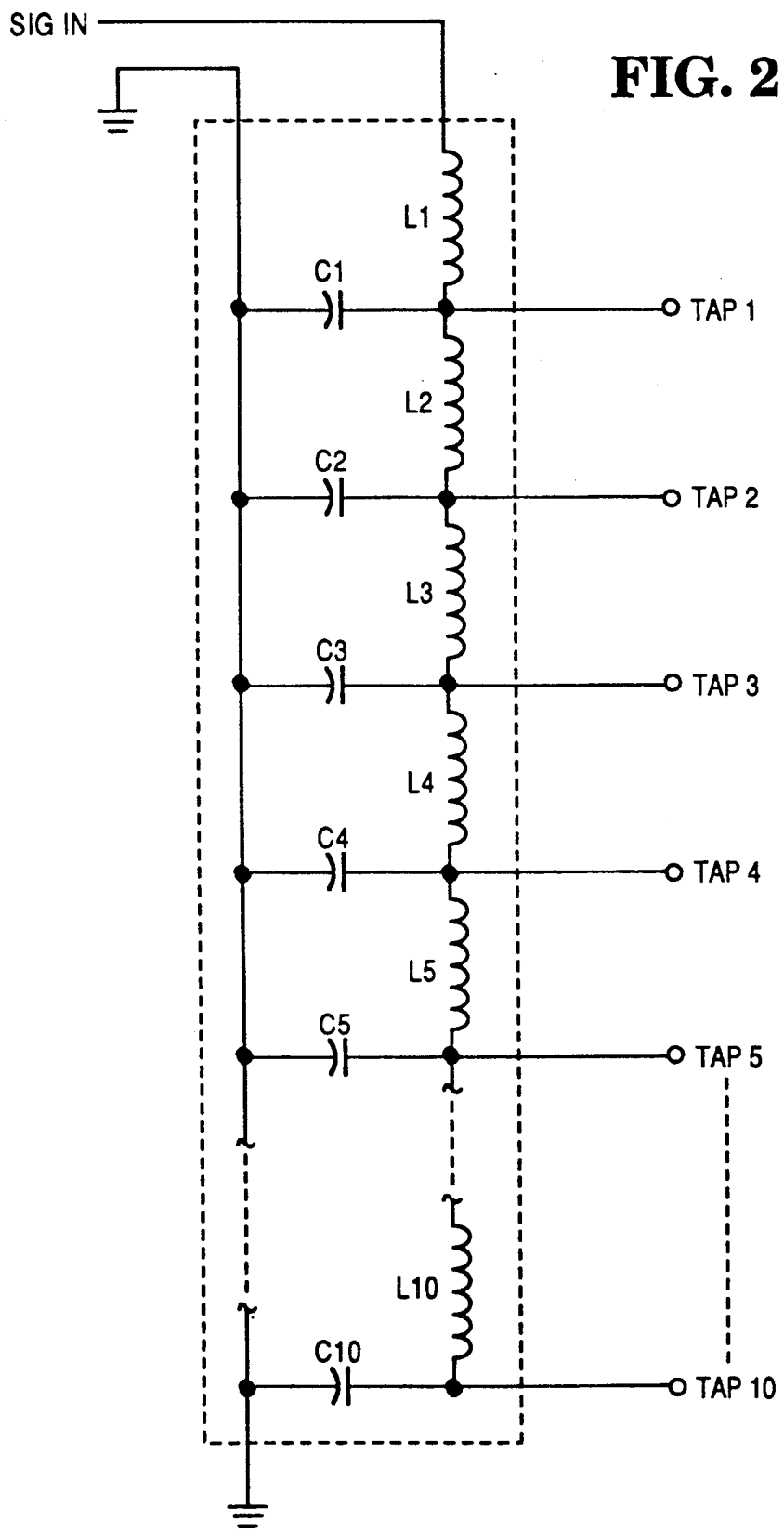

CIRCUIT HAVING A DELAY LINE FOR USE IN A DATA PROCESSING SYSTEM OR LOGIC SYSTEM

BACKGROUND OF THE INVENTION

The present invention relates to data processing systems and, more particularly, to a delay line used in such systems wherein the delay line has reduced data glitches.

Passive delay lines are commonly used in data processing systems in order to generate, shape and sequence various clocking, timing and other signals. Often a single, principal timing signal will be provided to one or more delay lines in order to generate a group of timing signals used throughout the system. Such delay lines commonly have an input and a number of output taps, with inductors and capacitors separating the taps in order provide a different amount of delay (relative to the input signal) in the output signal at each output tap.

A significant problem associated with delay lines is the electrical noise that they sometimes generate. This noise leads to glitches and errors in the data that is being processed in the data processing system.

One source of the noise in a delay line is the signal reflections caused by the capacitance of the load at each output tap. These reflections arise because of the transmission line characteristics of the signal path in the delay line. As is known to those familiar with transmission line theory, signal reflections will arise in a transmission line from discontinuities in the line. Generally, a signal will travel down a transmission line without being reflected as long as the characteristic impedance of the line remains uniform. In this context, the "characteristic impedance" is the impedance that the signal "sees" in front of it at any instant as it travels down the line. At the moment that the signal sees a discontinuity in the line (a variance from the otherwise uniform characteristic impedance), a signal is reflected back since the signal, at least momentarily, experiences a different impedance and there is a change in the voltage level of the signal in the line at the discontinuity. In a passive delay line of the type described above, a discontinuity will exist at each output tap where there is a load.

In the past, transmission line discontinuities at the output taps of a passive delay line were not viewed as a major problem, since the resulting signal reflections tended to be relatively small. As the physical size of integrated circuit chips that provide processing and memory functions in data processing systems has decreased, however, there has been a tendency to also decrease the amount of space required for other circuits, such as delay lines, by reducing the number of the delay lines used in the system. As a result, more loads are attached to fewer delay lines and, as multiple loads are attached to individual output taps of a delay line, the capacitance at each of those taps increases. The increased capacitance results in greater discontinuities on the signal path in the delay line and, hence, larger reflections and more glitches in the system.

SUMMARY OF THE INVENTION

There is provided, in accordance with the present invention, a circuit in a data processing system having a delay line with a plurality of outputs, a circuit element for receiving the output signal from at least one of the outputs, and a resistor connected between the one output of the delay line and the circuit element for isolating the circuit element from the output and thereby limiting the current flow to the circuit element and reducing signal reflections within the delay line.

In the described embodiment, two TTL logic gates each have two inputs, with one gate input connected to one output tap of a passive delay line and with the remaining three of the gate inputs connected to a second output tap of the delay line. The second output tap has a greater delay associated with it than the first output tap. Each gate input is connected to the output taps of the delay line by a 100 ohm resistor. Signal reflections in the signal path of the delay line are substantially reduced by each resistor.

It is therefore an object of the present invention to provide a new and improved data processing system wherein fewer data glitches originate in delay lines within the system.

It is another object of the present invention to provide such a system wherein a delay line is connected to various loads in such a fashion to minimize data glitches.

It is yet another object of the present invention to provide circuitry which reduces the size of signal reflections within a delay line in a data processing system.

It is still a further object of the present invention to permit multiple loads to be connected to one output tap of a delay line without resulting in excessive signal noise and data glitches at other output taps of the delay line.

These and other objects, features, and advantages of the present invention will become apparent from the following description and the attached drawings.

BRIEF DESCRIPTION OF THE DRAWINGS

FIG. 1 is a schematic circuit diagram of a passive delay line having its output taps connected to logic gates in a data processing system, in order to illustrate how data glitches arise in the system.

FIG. 2 is a schematic circuit diagram showing the circuit components within the passive delay line of FIG. 1.

FIG. 3 is a waveform diagram illustrating various signals in the circuitry of FIG. 1.

DETAILED DESCRIPTION OF THE PREFERRED EMBODIMENT

Figure 4:
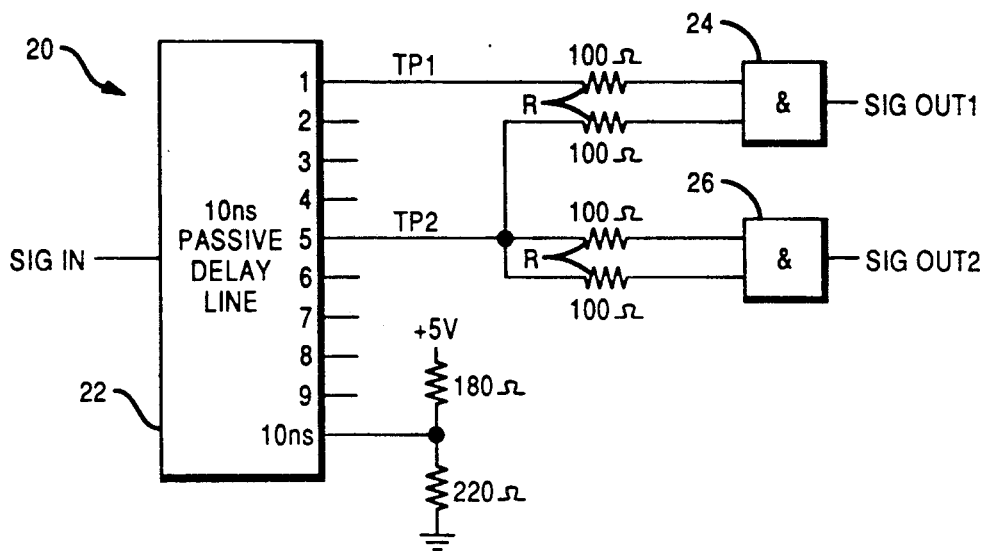
FIG. 4 is a schematic circuit diagram of a delay line connected to logic gates in accordance with the present invention.

Referring now to FIG. 1, there is seen a timing signal circuit 10 as might be found in a data processing system. The circuit 10 is conventional, taking an input pulse signal SIG IN and converting it into multiple signals SIG OUT1 and SIG OUT2 having different pulse width and phase relationships. The circuit 10 includes a ten nanosecond passive delay line 12 and two AND gates 14 and 16. It should be understood that AND gates 14 and 16 are shown only for purposes of illustration, since many different logic gates connected at the output taps are possible, depending on the kinds of pulses that are needed at the output of the circuit 10.

Tap 1 of the delay line 12 provides a signal TP1 to one input of gate 14, and tap 5 provides a signal TP2 to the second input of gate 14 as well as both inputs of gate 16. The other taps of the delay line 12 are not used, except for the last tap (tap 10), which is connected to a +5V source through a 180 ohm resistor and to ground through a 220 ohm resistor. This connection at tap 10 is a conventional termination of the delay line 12, in order to match its characteristic impedance, as will be appreciated by those skilled in the art.

The delay line 12 is conventional, with its internal construction shown in FIG. 2. It includes capacitors C1 through C10 (10 picofarads), each associated with one tap and connecting its tap to ground. It also includes inductors L1 through L10 (100 nanohenries), each associated with one tap and connecting its respective tap to the previous tap in the line (except L1, which connects tap 1 to the delay line input). The signal SIG IN at the delay line input is delayed one nanosecond at tap 1, two nanoseconds at tap 2, and so forth thorough tap 10, where it is delayed ten nanoseconds.

The waveforms in FIG. 3 illustrate the signal SIG IN at the input to the delay line 12 and the signals TP1 and TP2 at the taps 1 and 5, which are provided to the gates 14 and 16. The waveforms illustrate the reflections and resulting glitches which arise from having discontinuities in the signal path of the delay line 12, particularly the discontinuities caused by the multiple loads at the tap 5.

As can be seen in FIG. 3, a nearly square pulse signal is provided to the input of the delay line 12 as the signal SIG IN. Approximately one nanosecond after the rising edge of SIG IN occurs, the signal TP1 has a rising edge and approximately 5 nanoseconds after the rising edge of SIG IN occurs, there is a corresponding rising edge in the signal TP2. As can be seen in FIG. 3, the signal TP1 is significantly more distorted than the signal TP2 because of reflections in the delay line. In particular, as the pulse of SIG IN travels down the delay line toward tap 5, it encounters a significant discontinuity at tap 5 because of the increased capacitance resulting from the multiple loads at that tap (the loads being the one input to gate 14 and the two inputs to gate 16). The discontinuity results in a reflection which moves back in the direction of tap 1, appearing most visibly in the signal TP1 as the dip and then the sharp rise (noise spike) at point A. When the pulse ends, there is a reflection caused by the falling edge in the signal TP2 at tap 5, which again moves back in the direction of tap 1 and appears in signal TP1 as the noise spike at point B.

In the illustrated circuit, the gates 14 and 16 are TTL devices, and the noise spike at point B will have an unacceptably high likelihood of resulting in a data glitch. Such is the case since the gate 14 may see the noise spike at point B as a logic level 1 rather than a logic level 0, when in fact the signal TP1 should remain at a logic level 0 during this time period. In particular, TTL devices generally see a voltage level above 2.0V as a logic level 1 and a voltage below 0.8V as a logic level 0. A signal between 0.8V and 2.0V might be seen as either and is thus not a reliable signal.

While the noise spike at point A deviates an equal or greater amount (in comparison to the noise spike at point B) from the intended voltage level of the signal TP1, it does not present as serious a problem in the circuit 10 of FIG. 1, since the TTL gate 14 will see the signal as a logic 1 even though it is significantly above the nominal voltage level of a logic 1 signal (3.5V).

Referring now to FIG. 4, there is seen a timing signal circuit 20 in accordance with the present invention. The circuit 20 is similar to the circuit 10 of FIG. 1 and includes a ten nanosecond passive delay line 22 and two TTL AND gates 24 and 26 which are connected for receiving signals from taps 1 and 5 of the delay line 20.

Unlike the circuit 10 of FIG. 1, and in order to carry out the principal feature of the present invention, the inputs to the gates 24 and 26 are each connected to their respective taps of the delay line 20 by 100 ohm resistors R. The resistors R act to isolate the inputs of the gates 24 and 26 from the delay line 20, preventing a surge of current from the taps of the delay line into the capacitance of the loads (the loads being the inputs to the gates 24 and 26). The resistors R thus also prevent a signal reflection from that surge from being sent back through the delay line to the other taps.

Figure 5:
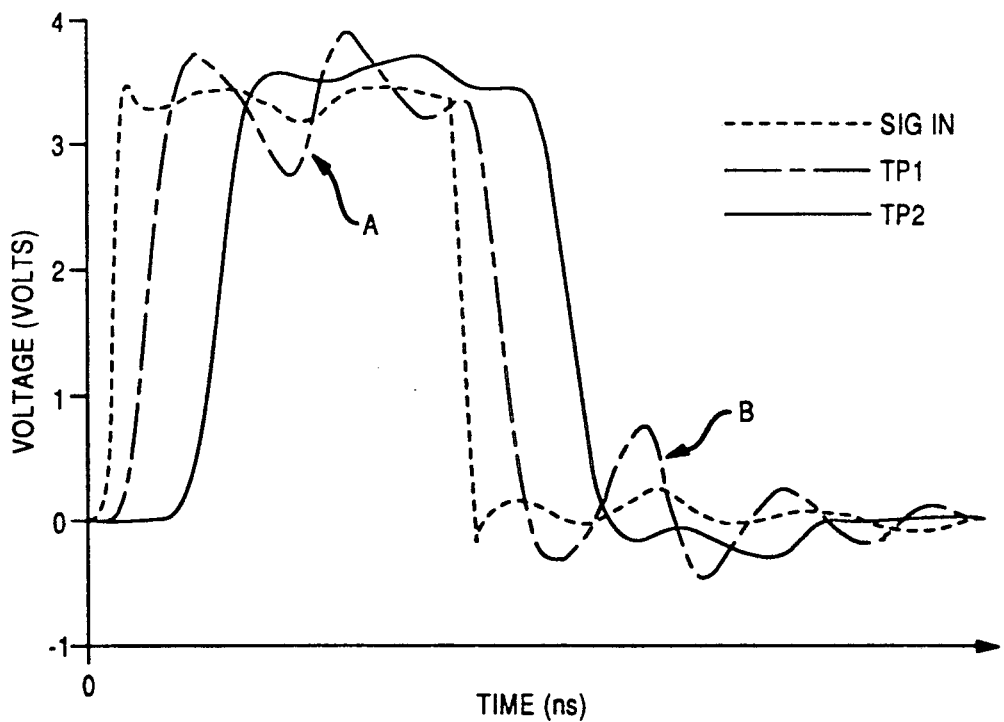
FIG. 5 is a waveform diagram illustrating various signals in the circuitry of FIG. 4.

The effect of the resistors R in the circuit 20 of FIG. 4 is best seen by the waveforms of FIG. 5, which represent the signals actually observed when a model of the circuit of FIG. 4 was constructed. In particular, it can be seen that the noise spikes at points A and B that were present in the signal TP1 in FIG. 3 have been substantially reduced at the corresponding points A and B in the signal TP1 in FIG. 5. Of particular importance is the magnitude of the noise spike B, which in FIG. 5 can be seen to be below 0.8V, the critical level for assuring that the logic gate 24 will see the signal TP1 at point B as a logic 0.

The resistors R will have values determined by the magnitude of the voltages and currents in the accompanying circuitry, the number of loads (and their capacitance) that are connected to the output taps of the delay line 22, and the degree to which the noise spikes need to be reduced. This, of course, must be balanced against the need for at least a predetermined minimum current flow through the gates at the output taps in order for them to respond to changes in logic levels. In the circuit 20, a 100 ohm resistance for each resistor R was found to be effective. By increasing the number of loads and changing the delay line characteristics, it was found that 200 ohm resistances could also be effective, as indicated in the following chart:

| Series resistor value (R) | 10 ns Delay Line | 20 ns Delay Line | 30 ns Delay Line |
|---|---|---|---|
| 0 Ohms | 1 | 1 | 1 |
| 100 Ohms | 4 | 2 | 2 |
| 200 Ohms | 8 | 4 | 4 |

In the above chart, a 20 nanosecond delay line has 2 nanoseconds of increasing delay from tap to tap (ten taps), and a 30 nanosecond delay line has 3 nanoseconds of increasing delay from tap to tap (ten taps). All values are for TTL loads, which nominally have voltage levels of approximately 3.5V for logic 1 and approximately 0v for logic 0, and where the maximum voltage of a noise spike at logic 0 should be no greater than 0.8V.

If the circuit 20 were to be used with ECL loads, which nominally have voltage levels of approximately −0.8V for logic 1 and −1.6 V for logic level 0, then the resistors R could have values in the range of approximately 10 to 20 ohms.

It can thus be seen that there has been provided by the present invention a circuit having a delay line for use in a data processing system, where data glitches resulting from signal reflections in the delay line are substantially reduced.

Although the presently preferred embodiment of the invention has been described, it will be understood that various changes may be made within the scope of the appended claims.

What is claimed is:

1. In a data processing system, a circuit comprising:
   a delay line having an input for receiving an input signal and a plurality of outputs, each output for providing an output signal representing the input signal delayed by a predetermined period of time;
   a circuit element for receiving the output signal from at least one of the outputs of said delay line; and
   a resistor connected between the one output of said delay line and said circuit element for limiting the current flow from the one output to said circuit element and thereby reducing signal reflections back from the one output to other outputs of said delay line;
   wherein said circuit element is a TTL logic gate and wherein said resistor has a resistance in the range of approximately 100 to 200 ohms.

2. In a data processing system, a circuit comprising:
   a delay line having an input for receiving an input signal and a plurality of outputs, each output for providing an output signal representing the input signal delayed by a predetermined period of time;
   a circuit element for receiving the output signal from at least one of the outputs of said delay line; and
   a resistor connected between the one output of said delay line and said circuit element for limiting the current flow from the one output to said circuit element and thereby reducing signal reflections back from the one output to other outputs of said delay line;
   wherein said circuit element is an ECL logic gate and wherein said resistor has a resistance in the range of approximately 10 to 20 ohms.

3. In a data processing system, a circuit for generating a plurality of timing signals comprising:
   a delay line having an input for receiving an input signal and a plurality of outputs, each output for providing an output signal representing the input signal delayed by a predetermined period of time;
   a plurality of circuit elements for receiving the output signals from at least two of the outputs of said delay line, each of said circuit elements having at least two inputs, with more than one of the inputs of said circuit elements connected to one of the outputs of said delay line; and
   a resistor between each of the inputs of said circuit elements and the output of said delay line connected to those inputs, for limiting the current flow between said delay line and said circuit elements;
   wherein said circuit elements are ECL logic gates and wherein each said resistor has a resistance in the range of approximately 10 to 20 ohms.

4. In a data processing system, a circuit for generating a plurality of timing signals comprising:
   a delay line having an input for receiving an input signal and a plurality of outputs, each output for providing an output signal representing the input signal delayed by a predetermined period of time;
   a plurality of circuit elements for receiving the output signals from at least two of the outputs of said delay line, each of said circuit elements having at least two inputs, with more than one of the inputs of said circuit elements connected to one of the outputs of said delay line; and
   a resistor between each of the inputs of said circuit elements and the output of said delay line connected to those inputs, for limiting the current flow between said delay line and said circuit elements;
   wherein said circuit elements are logic gates, and wherein said delay line comprises a plurality of inductors, one inductor connecting each output of said delay line to the previous output of said delay line, and a plurality of capacitors, each capacitor connecting each output of said delay line to a reference potential.

* * * * *

UNITED STATES PATENT AND TRADEMARK OFFICE
CERTIFICATE OF CORRECTION

PATENT NO. : 5,126,592

DATED : June 30, 1992

INVENTOR(S) : Nam K. Nguyen, et al.

It is certified that error appears in the above-identified patent and that said Letters Patent is hereby corrected as shown below:

On the title page, please insert the following:

Item [73] Assignee:  NCR Corporation, Dayton, Ohio--

--Attorney, Agent, or Firm--Gregory P. Gadson; Stephen F. Jewett--

Signed and Sealed this

Second Day of November, 1993

*Attest:*

BRUCE LEHMAN

*Attesting Officer*  Commissioner of Patents and Trademarks